US010584025B2

(12) United States Patent
Wang

(10) Patent No.: US 10,584,025 B2
(45) Date of Patent: Mar. 10, 2020

(54) MEMS MICROPHONE AND METHOD FOR MANUFACTURING THE SAME

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventor: Xianchao Wang, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 91 days.

(21) Appl. No.: 15/834,424

(22) Filed: Dec. 7, 2017

(65) Prior Publication Data
US 2018/0208455 A1    Jul. 26, 2018

(30) Foreign Application Priority Data

Jan. 22, 2017    (CN) .......................... 2017 1 0045042

(51) Int. Cl.
*H04R 9/00*    (2006.01)
*B81B 3/00*    (2006.01)
(Continued)

(52) U.S. Cl.
CPC ............ *B81B 3/0051* (2013.01); *B81B 3/001* (2013.01); *B81C 1/00103* (2013.01); *H04R 9/08* (2013.01);
(Continued)

(58) Field of Classification Search
CPC ............................ H04R 19/005; H04R 19/04; H04R 2201/003; B81B 3/0051
See application file for complete search history.

(56) References Cited

U.S. PATENT DOCUMENTS 8,921,957 B1 * 12/2014 Zhang ...................... H04R 1/04
                                                                  257/416
9,199,837 B2 * 12/2015 Kasai .................... B81B 7/0016
(Continued)

FOREIGN PATENT DOCUMENTS

CN        101222792        7/2008
CN        103021924        4/2013
(Continued)

OTHER PUBLICATIONS

Chinese Application No. 201710045042.0, Office Action dated Nov. 28, 2019, 11 pages.

*Primary Examiner* — Matthew A Eason
(74) *Attorney, Agent, or Firm* — Kilpatrick Townsend & Stockton LLP

(57) ABSTRACT

A method for manufacturing a semiconductor device includes providing a semiconductor structure including a first electrode layer, forming a sacrificial layer on the first electrode layer, the sacrificial layer including a recess having a pointed bottom defining a depth, forming a second electrode layer on the sacrificial layer, the second electrode layer including a first opening exposing the recess, and forming a support layer filling the recess, the first opening, and on the second electrode layer. A portion of the support layer filling the recess forms a stopper having a height equal to the depth (Continued)

of the recess. The method also includes forming a second opening extending through the support layer and the second electrode layer and exposing a surface of the sacrificial layer, and removing a portion of the sacrificial layer to form a cavity.

8 Claims, 5 Drawing Sheets

(51) Int. Cl.
    *B81C 1/00*     (2006.01)
    *H04R 9/08*     (2006.01)
    *H04R 19/04*     (2006.01)
    *H04R 31/00*     (2006.01)
    *H04R 19/00*     (2006.01)

(52) U.S. Cl.
    CPC ...... *H04R 19/04* (2013.01); *B81B 2201/0257* (2013.01); *B81B 2203/0127* (2013.01); *B81B 2203/0315* (2013.01); *B81B 2203/0392* (2013.01); *B81B 2203/04* (2013.01); *B81C 2201/0109* (2013.01); *H04R 19/005* (2013.01); *H04R 31/00* (2013.01); *H04R 2201/003* (2013.01)

(56) References Cited

U.S. PATENT DOCUMENTS

| | | | |
|---|---|---|---|
| 9,681,243 B2* | 6/2017 | Guo | B81B 3/0051 |
| 2002/0067663 A1 | 6/2002 | Loeppert et al. | |
| 2006/0233401 A1 | 10/2006 | Wang | |
| 2008/0123876 A1* | 5/2008 | Sato | H04R 19/016 381/174 |
| 2014/0353780 A1* | 12/2014 | Perletti | B81B 3/0021 257/416 |
| 2017/0127188 A1* | 5/2017 | Rombach | H04R 7/18 |
| 2018/0352337 A1* | 12/2018 | Klein | H04R 19/005 |

FOREIGN PATENT DOCUMENTS

| | | |
|---|---|---|
| CN | 105621346 | 6/2016 |
| CN | 107920318 | 4/2018 |

* cited by examiner

MEMS MICROPHONE AND METHOD FOR MANUFACTURING THE SAME

CROSS-REFERENCES TO RELATED APPLICATIONS

The present application claims priority to Chinese patent application No. 201710045042.0, filed with the State Intellectual Property Office of People's Republic of China on Jan. 22, 2017, the content of which is incorporated herein by reference in its entirety.

FIELD OF INVENTION

The present invention relates to semiconductor technology, and more particularly to a microphone and a method for manufacturing the same.

BACKGROUND OF THE INVENTION

In the field of electro-acoustic products, the microphone is a sensor that converts acoustic energy into electrical energy. A capacitive micro-electro-mechanical system (MEMS) microphone generally includes a vibration membrane, a fixed plate (back plate), and a cavity between the vibration membrane and the fixed plate. A capacitive MEMS microphone enables detection of a capacitive value change due to the displacement of the vibration membrane caused by a change in the acoustic pressure, and the detected capacitive value change is then converted to an electrical signal for processing.

The vibration membrane and the fixed plate may come into contact when the vibration membrane is in vibration. Once the vibration membrane and the fixed plate come into contact with each other, they may adhere to each other, and the microphone may not operate correctly. Therefore, a special structure (e.g., a stopper) needs to be designed to prevent the vibration membrane and the fixed plate from coming into contact with each other.

The adhesion probability between the vibration membrane and the fixed plate has a positive correlation with the surface area size of the stopper, that is, the smaller the surface area of the stopper, the smaller the adhesion probability between the vibration membrane and the fixed plate. Thus, attempts have been made to minimize the surface area of the stopper.

FIG. 1 is a cross-sectional view illustrating a morphology of a stopper according to a conventional manufacturing process. As shown in FIG. 1, a first sacrificial layer 101 is formed having an opening 111, then a second sacrificial layer 102 is formed on first sacrificial layer 101. Second sacrificial layer 102 has an opening 112 at a location corresponding to opening 111. Opening 112 defines the shape of a later formed stopper.

In order to reduce the surface area of the stopper, opening 111 has generally a relatively small size that causes opening 112 to have a narrow middle portion and wide end portions. When second sacrificial layer 102 has a relatively large thickness, voids may be present in opening 111, which may affect the shape of a later-formed stopper. A stopper having the shape shown in FIG. 1 may break when the microphone vibrates, thereby losing its effectiveness to prevent an adhesion between the vibration membrane and the fixed plate.

BRIEF SUMMARY OF THE INVENTION

In view of the above-described problems, the present inventor provides a novel solution to improve the shape and the structure of a stopper, a semiconductor device having the stopper, and a method for manufacturing the semiconductor device.

According to an embodiment of the present invention, a method for manufacturing a semiconductor device may include providing a semiconductor structure including a first electrode layer, forming a sacrificial layer on the first electrode layer, the sacrificial layer including a recess having a pointed bottom defining a depth of the recess, forming a second electrode layer on the sacrificial layer, the second electrode layer including a first opening exposing the recess, and forming a support layer filling the recess, the first opening, and on the second electrode layer. A portion of the support layer that fills the recess forms a stopper having a height equal to the depth of the recess. The method also includes forming a second opening extending through the support layer and the second electrode layer and exposing a surface of the sacrificial layer, and removing a portion of the sacrificial layer to form a cavity.

In one embodiment, forming the sacrificial layer includes forming a first sacrificial layer on the first electrode layer, the first sacrificial layer including a third opening extending to the first electrode layer, and forming a second sacrificial layer on the first sacrificial layer and completely filling the third opening, wherein the recess is disposed at a location of the second sacrificial layer corresponding to the third opening.

In one embodiment, the method may further include adjusting a thickness of the first sacrificial layer, an aspect ratio of the third opening, and a thickness of the second sacrificial layer based on the height of the stopper and a target thickness of the sacrificial layer. The target thickness of the sacrificial layer is a sum of thicknesses of the first sacrificial layer and the second sacrificial layer.

In one embodiment, adjusting the thickness of the first sacrificial layer, the aspect ratio of the third opening, and the thickness of the second sacrificial layer includes determining the thickness of the first sacrificial layer based on the height of the stopper, the thickness of the first sacrificial layer being greater than the height of the stopper, determining the aspect ratio of the third opening, determining a width of the third opening based on the aspect ratio of the third opening and the thickness of the first sacrificial layer, and determining the thickness of the second sacrificial layer based on the target thickness of the sacrificial layer and the thickness of the first sacrificial layer.

In one embodiment, each of the first sacrificial layer and the second sacrificial layer includes a dielectric material. In one embodiment, the dielectric material includes silicon oxide, silicon oxynitride, or ethyl orthosilicate.

In one embodiment, the first electrode layer includes a though hole extending through the first electrode layer.

In one embodiment, forming the second electrode layer on the sacrificial layer includes forming a second electrode material layer on the sacrificial layer and on the recess, and patterning the second electrode material layer to remove a portion of the second electrode material layer the recess. A remaining portion of the second electrode material layer on the sacrificial layer forms the second electrode layer.

In one embodiment, each of the first electrode layer and the second electrode layer includes polysilicon or monocrystalline silicon.

In one embodiment, removing a portion of the sacrificial layer includes using a buffered oxide etchant.

In one embodiment, the support layer includes silicon nitride. In one embodiment, the recess may include a plurality of recesses.

Embodiments of the present invention also provide a semiconductor device. The semiconductor device includes a first electrode layer, a sacrificial layer on the first electrode layer and including an opening exposing a surface of the first electrode layer, a second electrode layer on the sacrificial layer and on the opening, a cavity formed by the first electrode layer, the sacrificial layer, and the second electrode layer, a first opening extending through the second electrode layer and to the cavity; a support layer on the second electrode layer and having a stopper extending through the first opening and protruding into the cavity, the stopper having a pointed end, and a second opening extending through the support layer and the second electrode layer and to the cavity.

In one embodiment, the sacrificial layer includes a first sacrificial layer on the first electrode layer and a second sacrificial layer on the first sacrificial layer. In one embodiment, the first sacrificial layer and the second sacrificial layer each include a dielectric material. In one embodiment, the dielectric material includes silicon oxide, silicon oxynitride, or ethyl orthosilicate.

In one embodiment, the through hole extends through the first electrode layer.

In one embodiment, the first electrode layer and the second electrode layer each include polysilicon or monocrystalline silicon. In one embodiment, the support layer includes silicon nitride.

In one embodiment, the first opening and the second opening each may include a plurality of openings.

The following detailed description together with the accompanying drawings will provide a better understanding of the nature and advantages of the present invention.

BRIEF DESCRIPTION OF THE DRAWINGS

Embodiments of the present invention are described with reference to the accompanying drawings. In the drawings, like reference numbers may indicate identical or functionally similar elements.

DETAILED DESCRIPTION OF THE INVENTION

Figure 1:
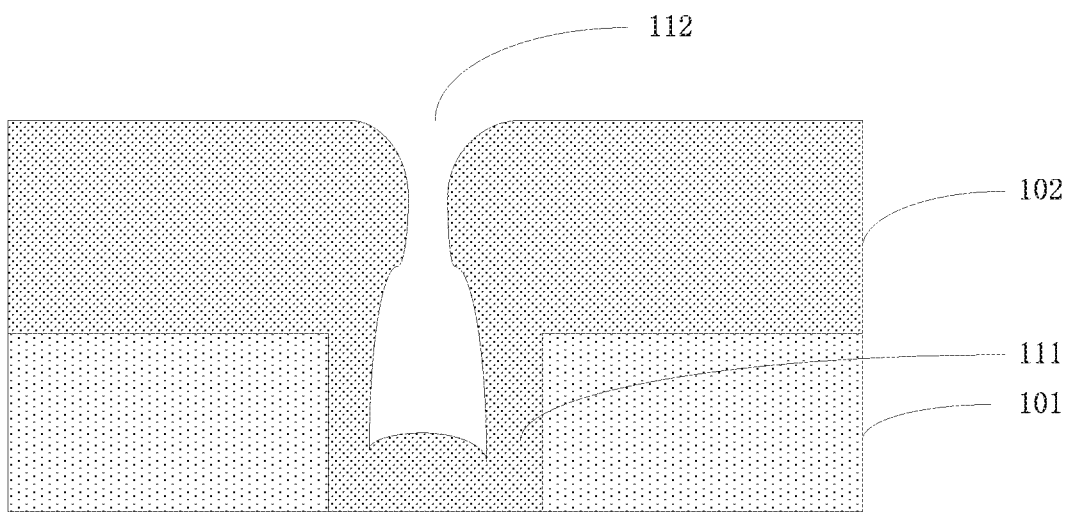
FIG. 1 s a schematic cross-sectional view illustrating a shape of a stopper manufactured by a conventional process.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a", "an" and "the" may include singular and plural references. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items.

The term "vertical" as used in this application is defined as a plane perpendicular to the conventional plane or surface of a wafer or substrate, regardless of the orientation of the wafer or substrate. The term "horizontal" refers to a direction perpendicular to the vertical as defined above.

The embodiments described and references in the disclosure to "one embodiment," "an embodiment," "an exemplary embodiment" indicate that the embodiments described may include a particular feature, structure, or characteristic. However, every embodiment may not necessary include the particular feature, structure or characteristic. As used throughout this disclosure, the terms "depositing" and "forming" are used interchangeably.

Embodiments of the invention are described herein with reference to cross-section illustrations that are schematic illustrations of idealized embodiments (and intermediate structures) of the invention.

It should be noted that like reference numerals are used to denote like elements, and once an element has been defined in a drawings, it will not be further described in other drawings.

Figure 2:
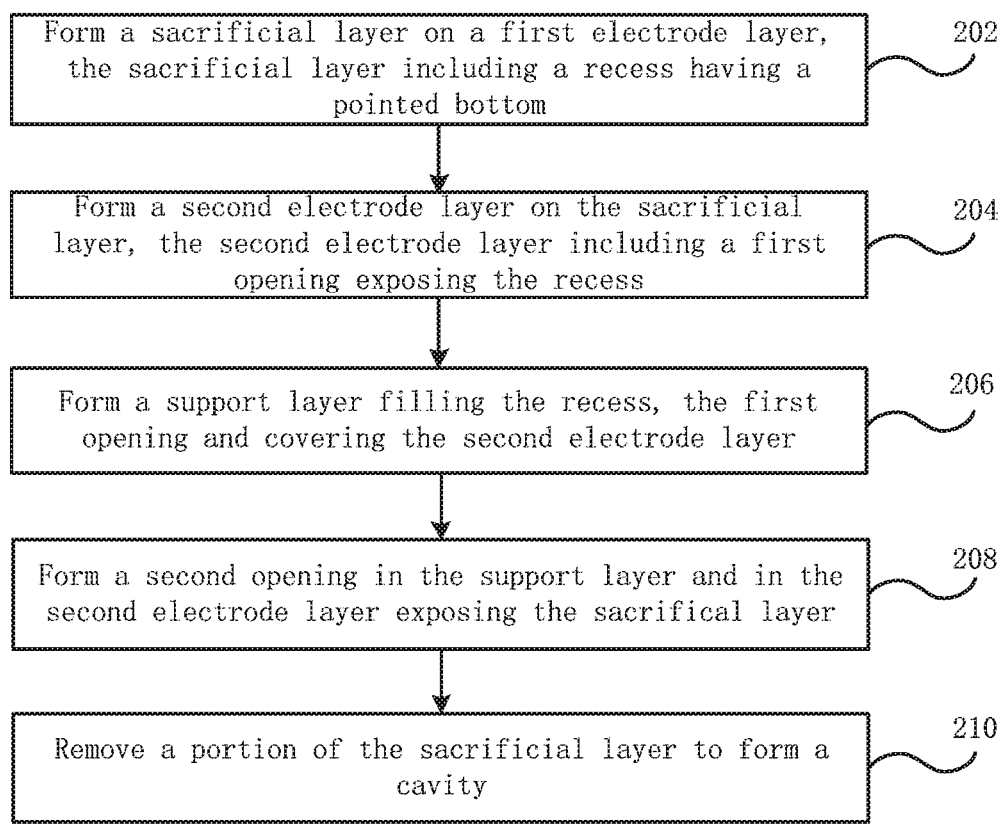
FIG. 2 is a simplified flowchart illustrating a method for manufacturing a semiconductor device according to an embodiment of the present invention.

FIG. 2 is a simplified flowchart illustrating a method for manufacturing a semiconductor device according to an embodiment of the present invention. FIGS. 3A to 3F are cross-sectional views illustrating intermediate stages of a semiconductor device in a manufacturing method according to an embodiment of the present invention. The method for manufacturing a semiconductor device according to embodiment of the present invention will be described in detail with reference to FIG. 2 and FIGS. 3A to 3F.

Figure 3A:
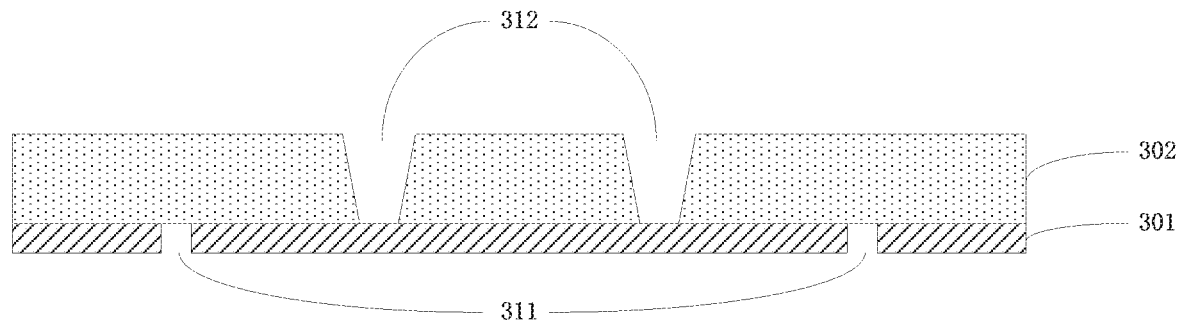
FIGS. 3A to 3F are cross-sectional views illustrating intermediate stages of a semiconductor device in a manufacturing method according to an embodiment of the present invention.
Figure 3B:
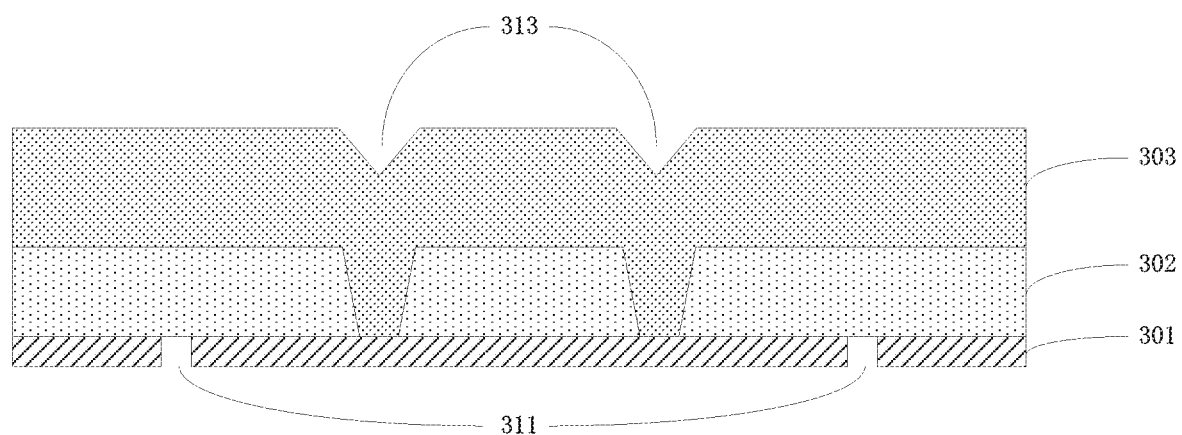

Referring to FIG. 2 and FIG. 3B, in step 202, a sacrificial layer is formed on a first electrode layer 301, the sacrificial layer has a recess 313 having a pointed bottom.

First electrode layer 301 may be used as a vibrating membrane plate of a microphone and may include polysilicon or monocrystalline silicon. The sacrificial layer may include a dielectric material, such as silicon dioxide. Recess 313 may include one or more recesses.

It should be noted that the side surfaces of recess 313 may be flat or curved, as long as the bottom has a pointed end portion. For example, the three-dimensional shape of recess 313 may be a triangular prism so that the later-formed stopper has also a triangular prism-shape.

In one embodiment, step 202 may be implemented in a manner as shown in FIGS. 3A and 3B.

Referring to FIG. 3A, a semiconductor substrate including a first electrode layer 301 is provided, a first sacrificial layer 302 is formed on first electrode layer 301. First sacrificial layer 302 has a third opening 312 extending to a surface of first electrode layer 301. First sacrificial layer 302 may include a dielectric material, e.g., silicon oxide, silicon oxynitride, or ethyl orthosilicate. In one embodiment, first electrode layer 301 may have one or more through-holes 311 extending through the first electrode layer. In one embodiment, first sacrificial layer 302 may have a plurality of third opening 312. The number of third opening 312 may be determined according to the desired surface area of a stopper.

Referring to FIG. 3B, a second sacrificial layer 303 is formed on first sacrificial layer 302, second sacrificial layer 303 completely fills third opening 312. A portion of second sacrificial layer 303 corresponding to the location of third opening 312 has a recess 313. Recess 313 has a pointed bottom. First sacrificial layer 302 and second sacrificial layer 303 may have the same material or different materials. For example, each of first sacrificial layer 302 and second sacrificial layer 303 may include a dielectric material, e.g., silicon oxide, silicon oxynitride, or ethyl orthosilicate.

In one embodiment, in forming first sacrificial layer 302 and second sacrificial layer 303, the thickness of first sacrificial layer 302, the aspect ratio (ratio of the depth and the width) of third opening 312, and the thickness of second sacrificial layer 302 may be adjusted according to a target height of the stopper and the target thickness of the sacrificial layer (i.e., the sum of thicknesses of first sacrificial layer 302 and second sacrificial layer 303), so that second sacrificial layer 302 completely fills third opening 312 and causes the depth of recess 313 to be equal to the target height of the stopper.

In one embodiment, the thickness of first sacrificial layer 302 may be determined based on the target height of the stopper, the thickness of first sacrificial layer 302 is greater than the target height of the stopper. Then, the aspect ratio of third opening 312 is determined, and the width of third opening 312 is determined based on the aspect ratio of third opening 312 and the thickness of first sacrificial layer 302. For example, the aspect ratio of third opening 312 may be adjusted to determine the different widths of the third opening. Thereafter, the thickness of second sacrificial layer 303 may be determined based on the target thickness of the sacrificial layer (i.e., the sum of thicknesses of first sacrificial layer 302 and second sacrificial layer 303) and the thickness of first sacrificial layer 302.

Effects of the aspect ratio of the third opening on the shape of the formed recess are analyzed below.

When the aspect ratio of the third opening is small, i.e., the width of the third opening is large, after the second sacrificial layer is deposited, the bottom of the formed recess is flat.

Increasing the aspect ratio of the third opening, i.e., reducing the width of the third opening after determining the thickness of the first sacrificial layer. When the aspect ratio of the third opening is increased to a certain extent, after the deposition of the second sacrificial layer, the bottom of the formed recess begins to shrink, which takes on the shape a pointed end.

After forming the bottom having a pointed end, the aspect ratio of the third opening continues to increase, the formed recess still has a pointed end, but the depth of the third opening is gradually reduced. When the aspect ratio of the third opening is increased to a certain extent, the depth of the third opening is equal to the target height of the stopper.

Therefore, the required depth of the third recess can be determined according to the target height of the stopper, and the aspect ratio of the third opening can then be determined.

Figure 3C:
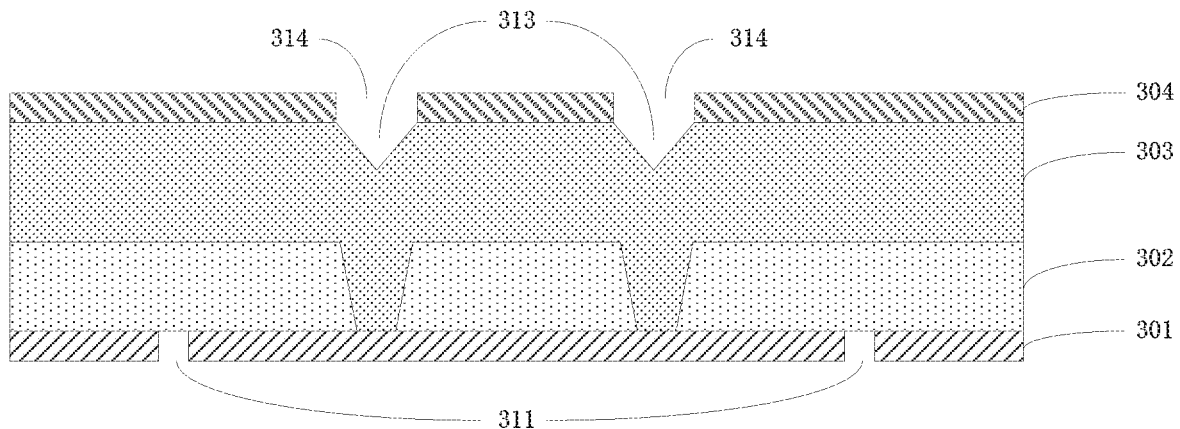

Next, referring to FIG. 2, in step 204, a second electrode layer 304 is formed on the second sacrificial layer, second electrode layer 304 has a first opening 314 exposing recess 313, as shown in FIG. 3C. Second electrode layer 304 may be used as a back plate for a microphone. In one embodiment, second electrode layer 304 may include polysilicon or monocrystalline silicon. It is to be noted that FIG. 3 shows the case where the sacrificial layer includes first sacrificial layer 302 and second sacrificial layer 303, in this case second electrode layer 304 is formed on second sacrificial layer 303.

In one embodiment, a second electrode material layer may be deposited on second sacrificial layer 303 and on recess 313, then the second electrode material layer may be patterned to remove a portion of the second electrode material layer disposed on recess 313, the remaining portion of the second electrode material layer forms second electrode layer 304, as shown in FIG. 3C.

Figure 3D:
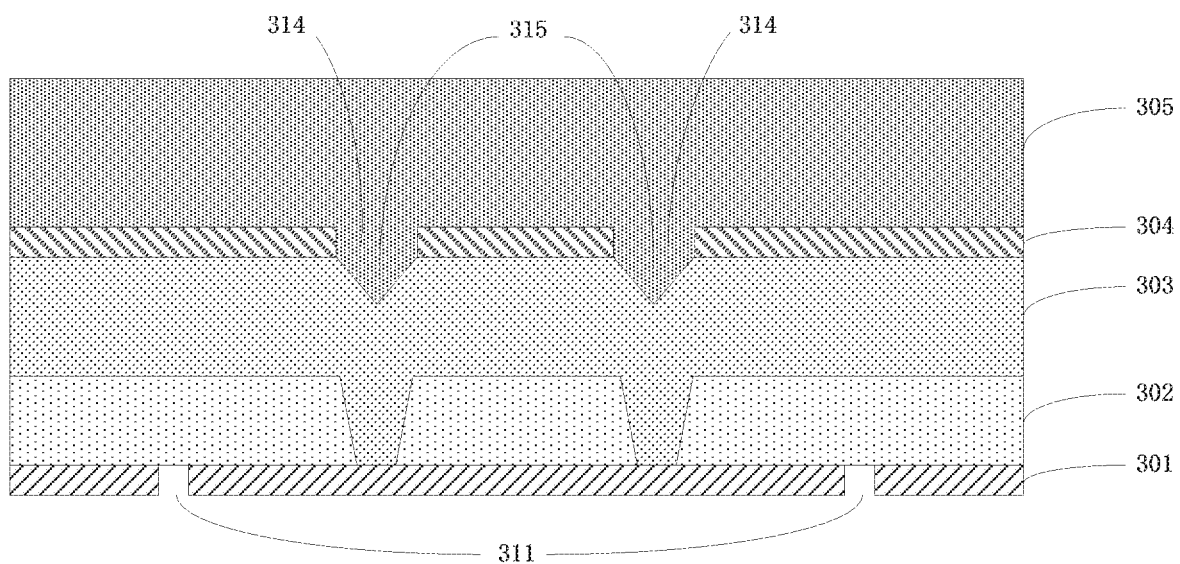

Next, referring to FIG. 2, in step 206, a support layer 305 is formed filling recess 313 and on second electrode layer 304. A portion of support layer 305 filling recess 313 forms a stopper 315 of the microphone, as shown in FIG. 3D. Support layer 305 may include a rigid insulating material such as silicon nitride.

Figure 3E:
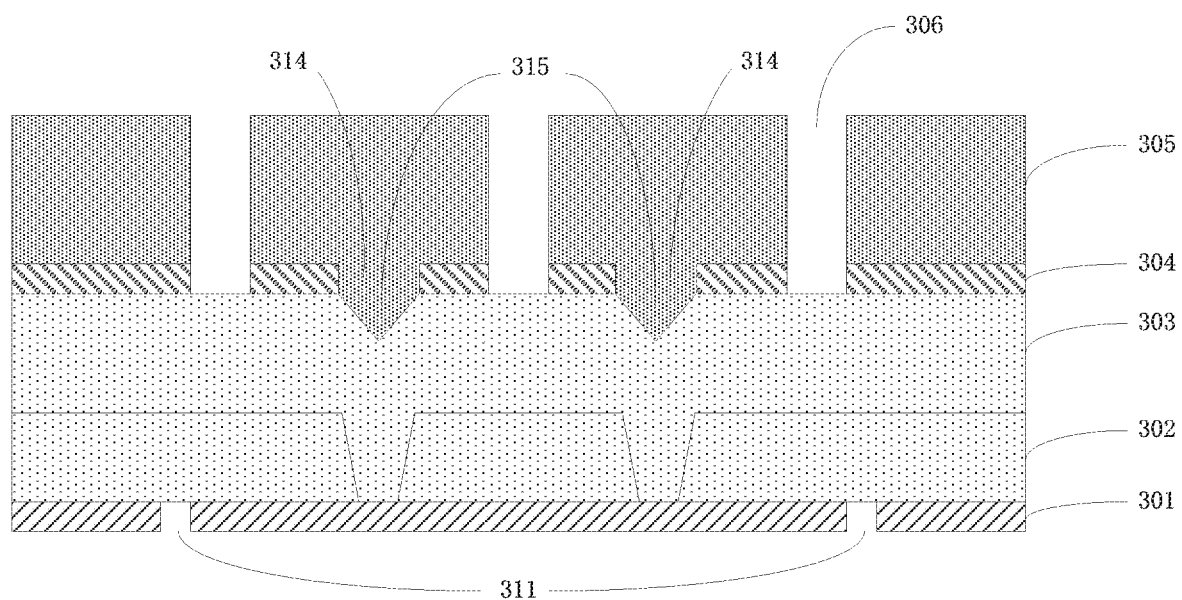

Next, in step 208, a second opening 306 is formed in support layer 305 and in second electrode layer 304. Second opening 306 exposes a surface of the sacrificial layer (e.g., second sacrificial layer 303), as shown in FIG. 3E. For example, support layer 305 and second electrode layer 304 may be etched to form second opening 306. In one embodiment, the location of second opening 306 does not overlap with the location of stopper 315, that is, when an etch process is performed on support layer 305 and second electrode layer 304 to form second opening 306, stopper 315 is not etched. In one embodiment, support layer 305 and second electrode layer 304 may be etched to form a plurality of second openings 306.

Figure 3F:
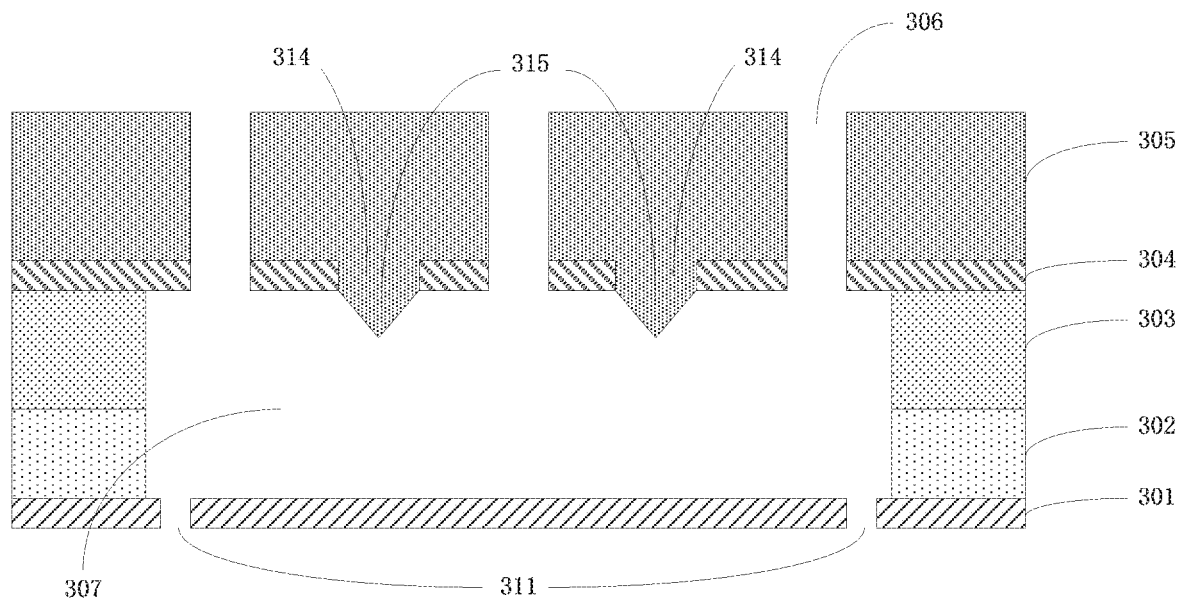

Next, in step 210, referring to FIG. 3F, a portion of the sacrificial layer is removed to form a cavity 307. For example, a portion of second sacrificial layer 303 and a portion of first sacrificial layer 302 may be removed by introducing a buffered oxide etchant (BOE) through second opening 306. Cavity 307 thus formed is surrounded by first electrode layer 301, second electrode layer 304, a remaining portion of first sacrificial layer 302, and a remaining portion of second sacrificial layer 303.

Embodiments of the present invention form a recess having a pointed bottom so that the stopper also has a pointed end. The present invention thus improves the shape of the stopper comparing to the shape of a conventional stopper that has a narrow middle portion and wide end portions which may be prone to breakage during manufacturing and/or during operations of the microphone. The device reliability can thus be improved using the stopper manufactured by the method of the present invention.

Further, the manufacturing method of the present invention does not require additional process steps that would increase manufacturing costs. The method can determine the appropriate thickness of the first sacrificial layer, the aspect ratio of the third opening, and the thickness of the second sacrificial layer based on the target height of the stopper, and the target total thickness of the first sacrificial layer and the second sacrificial layer to form a recess having a pointed bottom.

Embodiments of the present invention also provide a semiconductor device. Referring to FIG. 3F, the semiconductor device includes a first electrode layer 301, a sacrificial layer (e.g., the sacrificial layer includes first sacrificial layer 301 on first electrode layer 301 and second sacrificial layer 303 on first sacrificial layer 301) on first electrode layer 301, and an opening exposing a surface of first electrode layer 301. The semiconductor device further includes a second electrode layer 304 on the sacrificial layer and on the opening to form a cavity 307. The semiconductor device also includes a first opening 314 that extends through second electrode layer 304 and to the cavity. The semiconductor device also includes a support layer 305 having a portion on second electrode layer 304 and a stopper 315 extending through first opening 314 and protruding toward first electrode layer 301, stopper 315 has a pointed end. Cavity 307 is surrounded by first electrode layer 301, second electrode layer 304, and the sacrificial layer (e.g., first electrode layer 301 and second sacrificial layer 303 on first sacrificial layer 301).

The semiconductor device also includes a second opening 306 extending through support layer 305 and second electrode layer 304 to cavity 307.

In some embodiments, first sacrificial layer 302 and second sacrificial layer 303 may be of the same material. In some other embodiments, first sacrificial layer 302 and second sacrificial layer 303 may be of different materials.

In some embodiments, first sacrificial layer 302 and/or second sacrificial layer 303 may include a dielectric material such as silicon oxide, silicon oxynitride, or ethyl orthosilicate.

In some embodiments, first electrode layer 301 may have a through hole 311 extending through the first electrode layer.

In some embodiments, first electrode layer 301 and/or second electrode layer 302 may include polysilicon or monocrystalline silicon.

In some embodiments, support layer 305 may include silicon nitride.

In some embodiments, first opening 314 and second opening 306 each may include a plurality of openings.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A semiconductor device, comprising:
   a first electrode layer;
   a sacrificial layer on the first electrode layer and including an opening exposing a surface of the first electrode layer;
   a second electrode layer on the sacrificial layer and on the opening;
   a cavity formed by the first electrode layer, the sacrificial layer, and the second electrode layer;
   a first opening extending through the second electrode layer and to the cavity;
   a support layer on the second electrode layer and having a stopper extending through the first opening and protruding into the cavity, the stopper having a pointed end; and
   a second opening extending through the support layer and the second electrode layer and to the cavity.

2. The semiconductor device of claim 1, wherein the sacrificial layer comprises a first sacrificial layer on the first electrode layer and a second sacrificial layer on the first sacrificial layer.

3. The semiconductor device of claim 2, wherein the first sacrificial layer and the second sacrificial layer each comprise a dielectric material.

4. The semiconductor device of claim 3, wherein the dielectric material comprises silicon oxide, silicon oxynitride, or ethyl orthosilicate.

5. The semiconductor device of claim 1, wherein the through hole extends through the first electrode layer.

6. The semiconductor device of claim 1, wherein the first electrode layer and the second electrode layer each comprise polysilicon or monocrystalline silicon.

7. The semiconductor device of claim 1, wherein the support layer comprises silicon nitride.

8. The semiconductor device of claim 1, wherein the first opening and the second opening each comprise a plurality of openings.

\* \* \* \* \*